(12) United States Patent
Liaw

(10) Patent No.: US 7,236,391 B2
(45) Date of Patent: Jun. 26, 2007

(54) MAGNETIC RANDOM ACCESS MEMORY DEVICE

(75) Inventor: Jhon Jhy Liaw, Hsin-Chu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 68 days.

(21) Appl. No.: 10/907,977

(22) Filed: Apr. 22, 2005

(65) Prior Publication Data

US 2006/0239064 A1    Oct. 26, 2006

(51) Int. Cl.
G11C 11/00    (2006.01)
G11C 11/34    (2006.01)

(52) U.S. Cl. .................................. 365/158; 365/187

(58) Field of Classification Search ............. 364/158; 365/187, 188
See application file for complete search history.

(56) References Cited

U.S. PATENT DOCUMENTS

| | | | |
|---|---|---|---|
| 6,466,471 B1 | 10/2002 | Bhattacharyya | |
| 6,711,053 B1 | 3/2004 | Tang | |
| 6,778,433 B1 | 8/2004 | Tang | |
| 6,801,450 B2 | 10/2004 | Perner | |
| 6,829,160 B1* | 12/2004 | Qi et al. | 365/158 |
| 7,079,415 B2* | 7/2006 | Frey | 365/173 |

* cited by examiner

Primary Examiner—Richard T. Elms
Assistant Examiner—Allison P. Bernstein
(74) Attorney, Agent, or Firm—Baker & McKenzie LLP

(57) ABSTRACT

A memory device includes a memory cell having a read margin that exceeds the MR ratio of the memory cell's MR element. The memory cell includes a MR element, a reference transistor, and an amplifying transistor. In some embodiments, the MR element can include a magnetic tunneling junction sandwiched between electrode layers. One of the electrode layers can be connected to an input node, which is also connected to the drain or source node of the reference transistor and the gate node of the amplifying transistor. The drain node of the amplifying transistor is connected to a sense amplifier via a conductive program line. The memory cell uses the current through the MR element to control the gate-source voltage of the amplifying transistor, and senses the state of the memory cell based on the voltage drop (or current loss) across the amplifying transistor.

20 Claims, 4 Drawing Sheets

MAGNETIC RANDOM ACCESS MEMORY DEVICE

TECHNICAL FIELD

This application relates to random access memory devices that include magnetoresistive memory elements.

CROSS REFERENCE TO RELATED APPLICATIONS

This application relates to a commonly-assigned patent application, entitled "Magnetic Random Access Memory Device".

BACKGROUND

Magnetic random access memory (MRAM) is a type of non-volatile memory that uses magnetism rather than electrical power to store data. FIG. 1 shows a schematic diagram of a portion 10 of an MRAM array, which includes a plurality of memory cells 12–19. Each memory cell 12–19 includes a magnetoresistive (MR) element 20–27 and a transistor 30–37. The transistors 30–33 are coupled to each other via a word line (WL1) 40, and transistors 34–37 are coupled to each other via a word line (WL2) 41, where the word lines 40, 41 form the gate electrode for the transistors 30–37. The transistors 30–33 are also coupled to each other via a program line (PL1) 42, and transistors 34–37 are coupled via a program line (PL2) 43, where the program lines 42, 43 serve as virtual ground lines. Similarly, the MR elements 20 and 24 are coupled to each other by bit line (BL1) 45, MR elements 21 and 25 are coupled to each other by bit line (BL2) 46, MR elements 22 and 26 are coupled to each other by bit line (BL3) 47, and MR elements 23 and 27 are coupled to each other by bit line (BL4) 48. The bit lines 45–48 are typically somewhat perpendicular to the word lines 40, 41 and the program lines 42, 43.

Each of the MR elements 20–27 is a multi-layer magnetoresistive element, such as a magnetic tunneling junction (MTJ) or a giant magnetoresistive (GMR) element. FIG. 2 shows an example of a typical MTJ element 50. The MTJ element 50 includes the following layers: a top electrode layer 52, a free layer 53, a spacer 54 which serves as a tunneling barrier, a pinned layer 55, a pinning layer 56, and a bottom electrode 57. The free layer 53 and the pinned layer 55 are constructed of ferromagnetic material, for example cobalt-iron or nickel-cobalt-iron. The pinning layer 56 is constructed of antiferromagnetic material, for example platinum manganese. Magnetostatic coupling between the pinned layer 55 and the pinning layer 56 causes the pinned layer 55 to have a fixed magnetic moment. The free layer 53, on the other hand, has a magnetic moment that, by application of a magnetic field, can be switched between a first orientation, which is parallel to the magnetic moment of the pinned layer 55, and a second orientation, which is antiparallel to the magnetic moment of the pinned layer 55.

The spacer 54 interposes the pinned layer 55 and the free layer 53. The spacer 54 is composed of insulating material, for example aluminum oxide, magnesium oxide, or tantalum oxide. The spacer 54 is formed thin enough to allow the transfer (tunneling) of spin-aligned electrons when the magnetic moments of the free layer 53 and the pinned layer 55 are parallel. On the other hand, when the magnetic moments of the free layer 53 and the pinned layer 55 are antiparallel, the probability of electrons tunneling through the spacer 54 is reduced. This phenomenon is commonly referred to as spin-dependent tunneling (SDT).

As shown in FIG. 3, the electrical resistance through the MTJ 50 (e.g., through layers 52–57) increases as the moments of the pinned and free layers become more antiparallel and decreases as they become more parallel. In an MRAM memory cell, the electrical resistance of the MTJ 50 can therefore be switched between first and second resistance values representing first and second logic states. For example, a high resistance value can represent a logic state "1" and a low resistance value can represent a logic state "0". The logic states thus stored in the memory cells can be read by passing a sense current through the MR element and sensing the resistance. For example, referring back to FIG. 1, the logic state of memory cell 12 can be read by passing a sense current through bit line (BL1) 45, activating transistor 30 via word line (WL1) 40, and sensing the current passing to program line (PL1) 42.

During a write operation, electrical current flows through a program line 42, 43 and a bit line 45–48 that intersect at the target memory cell 12–19. For example, in order to write to memory cell 13, a current is passed through program line (PL1) 42 and a current is passed through bit line (BL2) 46. The magnitude of these currents is selected such that, ideally, the resulting magnetic fields are not strong enough on their own to affect the memory state of the MR elements 20–23 and 25, but the combination of the two magnetic fields (at MR element 21) is sufficient for switching the memory state (e.g., switching the magnetic moment of the free layer 53) of the MR element 21.

SUMMARY

In a memory cell such as those shown in FIG. 1, the difference (read margin) between a current representative of logic state "1" and another current representative of logic state "0" depends directly on the magnetoresistive ratio (MR ratio) of the MR element. Thus, in such memory cells a high MR ratio is desired in order to be able to discern the difference between the to logic states. The MR ratio of an MR element varies according to applied voltage, for example as the applied voltage increases, the MR ratio decreases. Thus, since a high MR ratio is usually necessary for MRAM operation, it is necessary to keep the applied voltage relatively low so that the MR ratio does not drop to a point where the memory cell is unreadable. However, this limits access speed since a higher access speed requires a higher voltage.

Disclosed herein is an improved magnetoresistive memory device that includes a memory cell having a read margin that exceeds the MR ratio of the memory cell's MR element. The memory cell includes a MR element, a reference transistor, and an amplifying transistor. In some embodiments, the MR element can include a magnetic tunneling junction sandwiched between upper and lower electrode layers. The upper electrode layer can be connected to a conductive bit line. The lower electrode layer can be connected to an input node, which is also connected to the drain or source node of the reference transistor and the gate node of the amplifying transistor. The drain node of the amplifying transistor is connected to a sense amplifier via a conductive program line. Instead of passing a portion of a read current through an MR element and sensing the remaining read current as is done in prior memory cells, the present memory cell uses the current through the MR element to control the gate-source voltage of the amplifying transistor, and senses the state of the memory cell based on the voltage drop (or current loss) across the amplifying transistor.

BRIEF DESCRIPTION OF THE DRAWINGS

Embodiments are illustrated by way of example in the accompanying figures, in which like reference numbers indicate similar parts, and in which.

DETAILED DESCRIPTION

Figure 2:
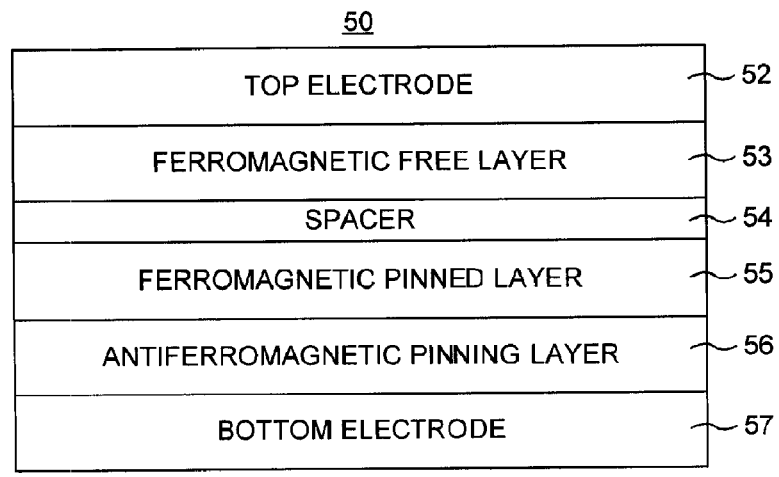
FIG. 2 shows a schematic block diagram of a typical MTJ structure.
Figure 3:
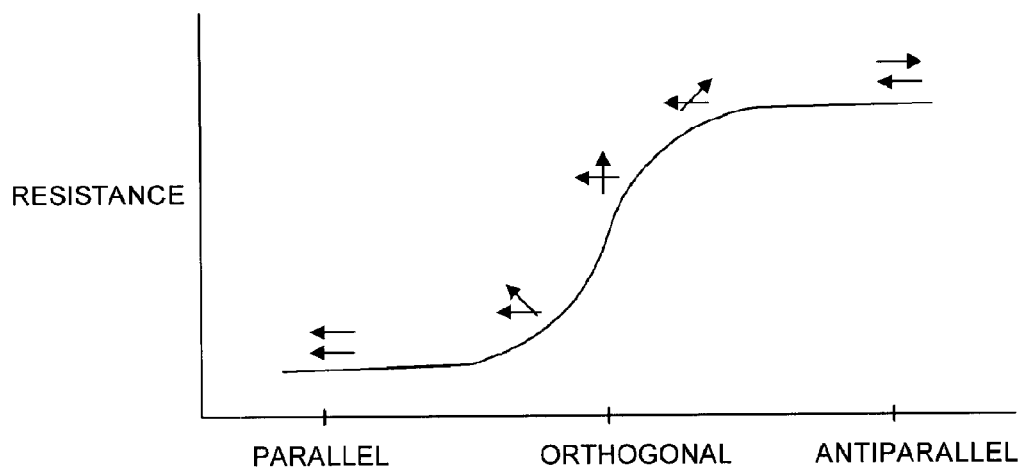
FIG. 3 shows a graph of the relationship between resistance and the relative magnetic orientations of the free and pinned layers in the MTJ shown in FIG. 2.
Figure 4:
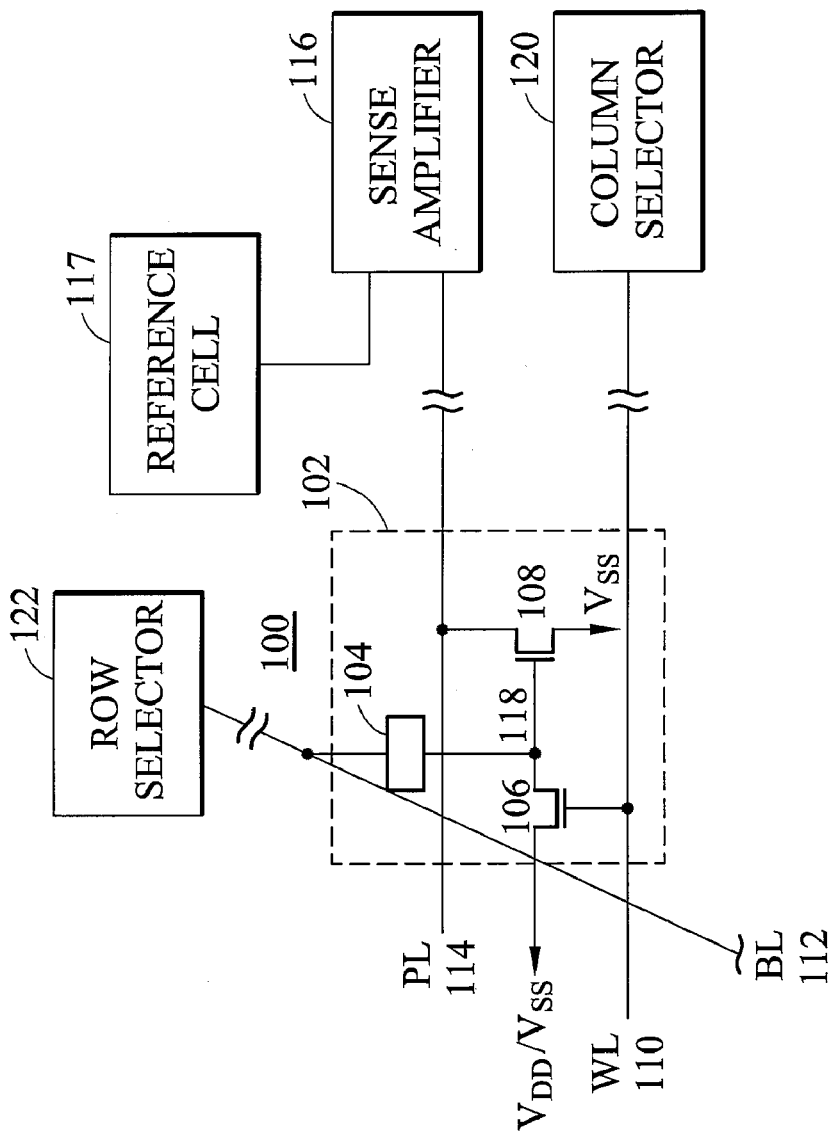
FIG. 4 shows a schematic diagram of a memory cell having a magnetoresistive element and two transistors.

FIG. 4 shows a schematic diagram of a portion 100 of an MRAM array, which includes a memory cell 102. The memory cell 102 includes a magnetoresistive (MR) element 104, a reference transistor 106, and an amplifying transistor 108. The MR element 104 can include layers 52–57 shown in FIG. 2 and described above. The reference transistor 106 has a gate node coupled to a word line (WL) 110, a source node coupled to either a predetermined voltage $V_{DD}$ or a signal ground $V_{SS}$ (depending on which of the read schemes described below is used), and a drain node coupled to the bottom electrode (57 in FIG. 2) of the MR element 104. The amplifying transistor 108 has a gate node connected to the drain node of the reference transistor 106 and to the bottom electrode 57 of the MR element 104. The amplifying transistor 108 also has a drain node connected to a program line (PL) 114 and a source node connected to $V_{SS}$. The top electrode (52 in FIG. 2) of the MR element 104 is coupled to a bit line (BL) 112. The program line (PL) 114 extends in the vicinity of the MR element 104 for write operations.

Components of the MRAM array external to the memory cell 102 include a sense amplifier 116 connected to the PL 114. During a read operation, the sense amplifier 116 can determine the logic state of the memory cell 102 based on whether the voltage (or current) on the PL 114 is higher or lower than a reference voltage (or current). In some embodiments, the reference voltage (or current) can come from an optional reference cell 117 connected to the sense amplifier 102. The reference cell 117 can include an MR element fixed at a midpoint resistance level. In other embodiments, a fixed voltage (or current) can be supplied to the sense amplifier 116 for use as a reference voltage (or current).

The MRAM array can further include a column selector 120 and a row selector 122. The column and row selectors 120, 122 are used for addressing cells of the MRAM array. For this purpose, the column selector 120 controls the voltage level of the WL 110 and the row selector controls the voltage level of the BL 112.

As mentioned above, there are multiple options for read schemes for the portion 100 of the MRAM array shown in FIG. 4.

A first read scheme can be used when the reference transistor 106 has its source node connected to signal ground $V_{SS}$ (e.g., where $V_{SS}$ is signal ground). In order to read the data bit stored in the MR element 104, the column selector 120 sets the WL 110 to a predetermined voltage, for example a voltage in a range of 0.3V to 1.8V. The row selector 122 sets the BL 112 to a predetermined voltage, for example a voltage in a range of 0.3V to 1.5V. The voltage VIN at input node 118 will depend on the resistance of the MR element 104 as follows:

$$V_{IN} = V_{BL} \frac{R_{REF}}{R_{REF} + R_{MR}} \quad (1)$$

where $R_{REF}$ is the resistance across the reference transistor 106 and $R_{MR}$ is the resistance across the MR element 104. The current or voltage level of the PL 114 can then be detected by the sense amplifier 116 in order to detect the logic state stored in the memory cell 102. In embodiments that include a reference cell 117, for example, the sense amplifier 116 can detect the logic state of the memory cell 102 based on a comparison of the voltage level of the PL 114 to a reference voltage level received from the reference cell 117.

Alternatively, the polarity across the reference transistor 106 and the MR element 104 can be reversed. Specifically, a second read scheme can have the BL 112 set to signal ground $V_{SS}$ and the source node of the reference transistor 106 connected to a predetermined voltage $V_{DD}$, for example a voltage in a range of 0.3V to 1.5V. The WL 110 is still set to a predetermined voltage, for example a voltage in a range of 0.3V to 1.8V, in order to read the data bit stored in the MR element 104. A predetermined voltage level $V_{DD}$, for example a voltage in a range of 0.3V to 1.8V, is applied to the PL 114. As in the first read scheme, the voltage VIN at input node 118 will depend on the resistance of the MR element 104 according to Equation (1) above. The current or voltage level of the PL 114 can then be detected by the sense amplifier 116 in order to detect the logic state stored in the memory cell 102. In embodiments that include a reference cell 117, for example, the sense amplifier 116 can detect the logic state of the memory cell 102 based on a comparison of the voltage level of the PL 114 to a reference voltage level received from the reference cell 117

Figure 1:
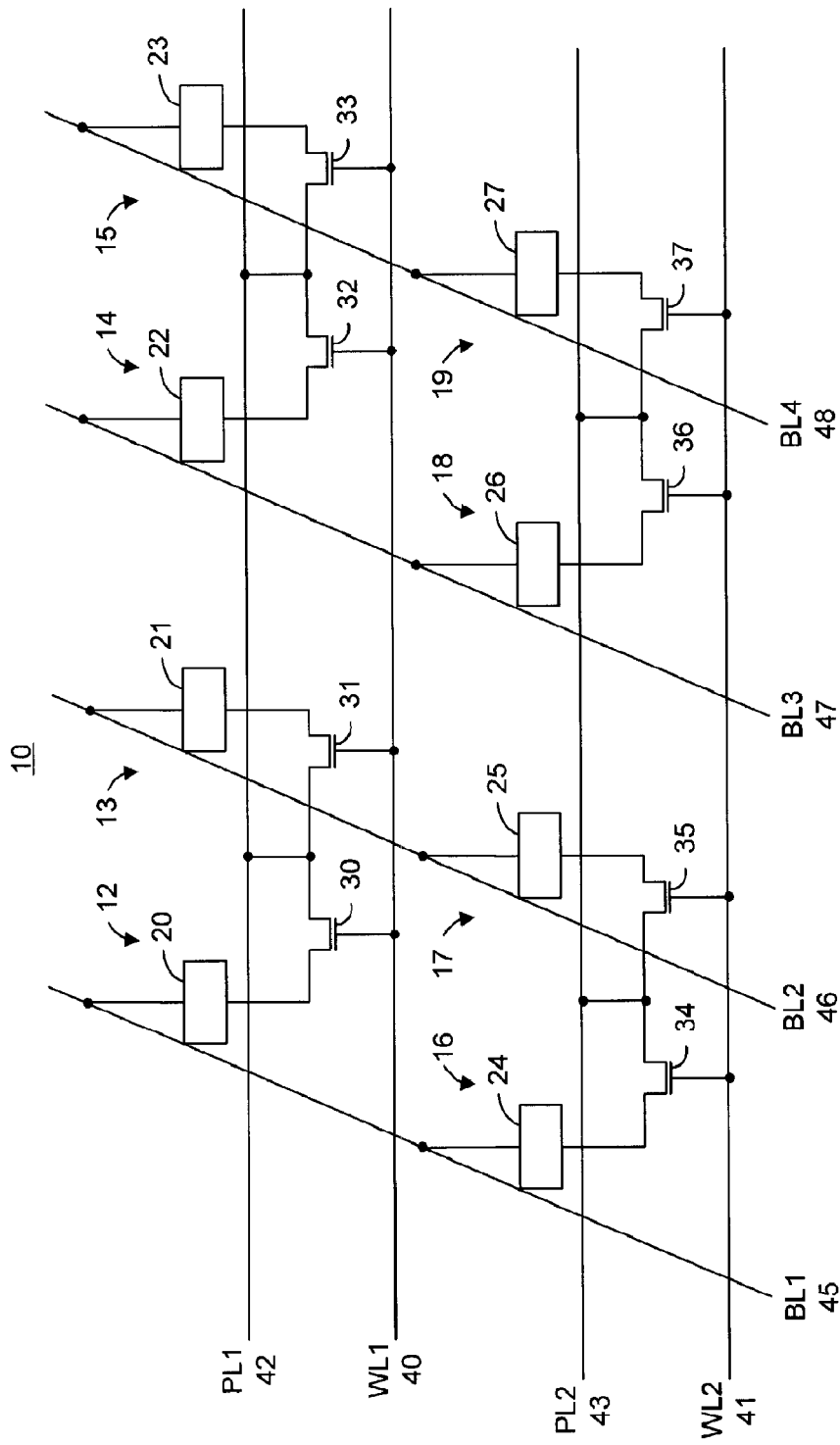
FIG. 1 shows a schematic diagram of a portion of an MRAM array.

As a result of including the amplifying transistor 108 in the memory cell 102 and using a read operation such as those described above, a greater voltage margin for reading the memory cell can be obtained. For example, in the prior memory cell 12 shown in FIG. 1, the bit line current is sensed during a read operation, and varies based on the resistance of the MR element 20 according to Equation (2) below.

$$I_{BL} = \frac{V_{BL}}{R_{MR} + R_{TR}} \quad (2)$$

In Equation (2), $I_{BL}$ is the current of the bit line 45, $V_{BL}$ is the voltage of the bit line 45, $R_{MR}$ is the resistance of MR element 20, and $R_{TR}$ is the resistance across the transistor 30. If the MR ratio of the MR element 20 is 30%, and $R_{MR} >> R_{TR}$, then the difference between $I_{BL}$ "High" (e.g., representative of a logic state "0") and $I_{BL}$ "Low" (e.g., representative of a logic state "1") provides for a read margin of only about 30%.

In contrast, for the memory cell 102 shown in FIG. 4, the logic state can be sensed by detecting current on the program line 114, which varies according to the voltage at the input node 118. In this case, if the MR ratio is 30% and the resistance $R_{REF}$ across the reference transistor 106 that is close to the resistance $R_{MR}$ across the MR element 104, then the difference between $I_{PL}$ "High" (e.g., representative of a logic state "0") and $I_{PL}$ "Low" (e.g., representative of a logic state "1") can provide for a read margin in a range of 50% to 200%.

The increased read margin is particularly advantageous for embodiments that include a reference cell 117. In such embodiments, a read operation depends on the ability of the sense amplifier 116 to accurately determine a logic state based on whether the voltage from the memory cell 102 is higher or lower than the reference voltage received from the reference cell 117. However, in a large array of memory cells 102, slight differences between MR elements 104 can result in variations among the read voltages received from different memory cells 102. If the read margin is too low, as in prior devices, such deviations in read voltages can result in false readings. On the other hand, by increasing the read margin according to the present application, the impact of differences among the MR elements 104 is greatly reduced if not eliminated. As a result, a more reliable memory device can be realized.

A write operation can be performed by passing sufficiently high currents through the PL 114 and the BL 112. The magnitude of these currents is selected such that, ideally, the resulting magnetic fields are not strong enough on their own to affect the memory state of the MR element 104 (or other MR elements not shown), but the combination of the two magnetic fields (at MR element 104) is sufficient for switching the memory state (e.g., switching the magnetic moment of the free layer 53) of the MR element 104. During a write operation, the WL 110 is set to signal ground $V_{SS}$.

Figure 5:
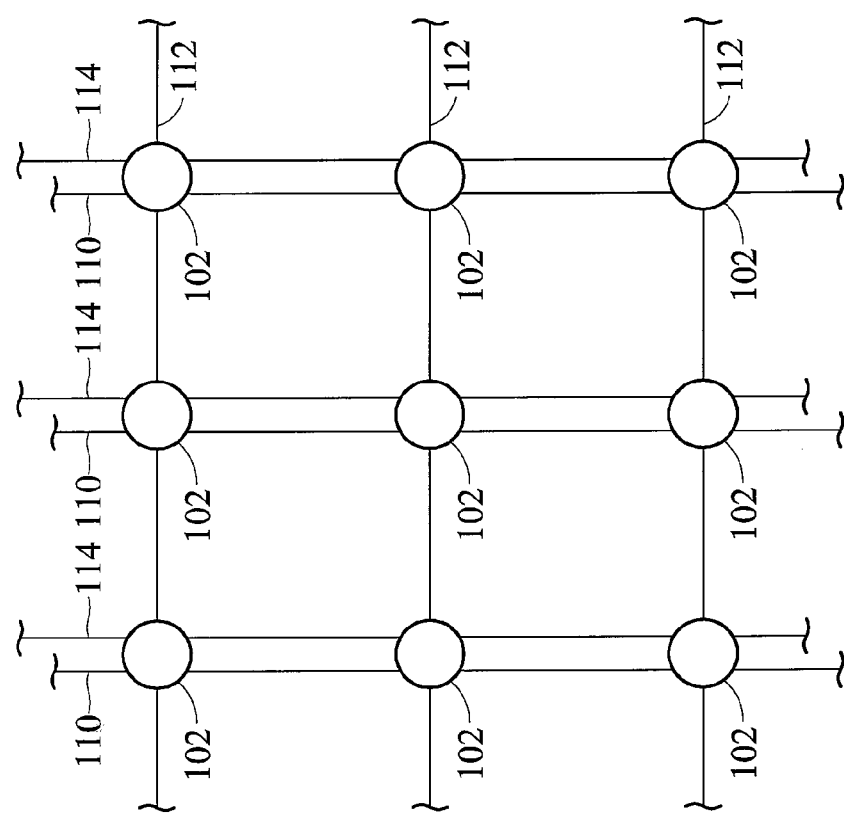
FIG. 5 shows a simplified plan view of a memory array including memory cells such as the one shown in FIG. 4.

FIG. 5 shows a simplified plan view of an exemplary layout of an MRAM array composed of memory cells 102. The memory cells 102 are arranged in rows and columns. Each memory cell 102 of a particular row is connected by a bit line 112, while each memory cell 102 of a particular column is connected by a program line 114 and a word line 110.

While various embodiments in accordance with the principles disclosed herein have been described above, it should be understood that they have been presented by way of example only, and are not limiting. Thus, the breadth and scope of the invention(s) should not be limited by any of the above-described exemplary embodiments, but should be defined only in accordance with the claims and their equivalents issuing from this disclosure. Furthermore, the above advantages and features are provided in described embodiments, but shall not limit the application of such issued claims to processes and elements accomplishing any or all of the above advantages.

Additionally, the section headings herein are provided for consistency with the suggestions under 37 CFR 1.77 or otherwise to provide organizational cues. These headings shall not limit or characterize the invention(s) set out in any claims that may issue from this disclosure. Specifically and by way of example, although the headings refer to a "Technical Field," such claims should not be limited by the language chosen under this heading to describe the so-called technical field. Further, a description of a technology in the "Background" is not to be construed as an admission that technology is prior art to any invention(s) in this disclosure. Neither is the "Summary" to be considered as a characterization of the invention(s) set forth in issued claims. Furthermore, any reference in this disclosure to "invention" in the singular should not be used to argue that there is only a single point of novelty in this disclosure. Multiple inventions may be set forth according to the limitations of the multiple claims issuing from this disclosure, and such claims accordingly define the invention(s), and their equivalents, that are protected thereby. In all instances, the scope of such claims shall be considered on their own merits in light of this disclosure, but should not be constrained by the headings set forth herein.

What is claimed is:

1. An MRAM memory cell comprising:
   a magnetoresistive element having an electrode layer;
   a first transistor having a drain node and a source node, wherein the source node is connected to the electrode layer of the magnetoresistive element and the drain node is connected to receive a predetermined voltage; and
   a second transistor having a gate node that is connected to the electrode layer of the magnetoresistive element.

2. An MRAM memory cell according to claim 1, wherein the second transistor further includes a drain node and a source node, and wherein the source node of the second transistor is connected to a program line located proximate to the magnetoresistive element.

3. An MRAM memory cell according to claim 1, wherein the second transistor further includes a drain node and a source node, and wherein the drain node of the second transistor is connected to a program line located proximate to the magnetoresistive element.

4. An MRAM memory cell according to claim 1, wherein the first transistor is a reference transistor.

5. An MRAM memory cell according to claim 1, wherein the second transistor is an amplifying transistor.

6. An MRAM memory cell according to claim 1, wherein the magnetoresistive element further comprises a magnetic tunneling junction.

7. An MRAM memory device according to claim 1, further comprising a first conductive line connected to the second electrode layer of the magnetoresistive element.

8. An MRAM memory device according to claim 7, further comprising a second conductive line connected to a drain node of the second transistor.

9. An MRAM memory device according to claim 8, further comprising a third conductive line connected to a gate node of the first transistor.

10. An MRAM memory device comprising:
    a memory cell that includes a magnetoresistive element, a reference transistor, and an amplifying transistor,
    wherein the magnetoresistive element includes first and second electrode layers,
    wherein the reference transistor includes a drain node and a source node,
    wherein the source node of the reference transistor is connected to the first electrode layer of the magnetoresistive element and the drain node of the reference transistor is connected to receive a predetermined voltage, and
    wherein the amplifying transistor includes a gate node that is connected to the magnetoresistive element.

11. An MRAM memory device according to claim 10, further comprising a first conductive line connected to the second electrode layer of the magnetoresistive element.

12. An MRAM memory device according to claim 11, further comprising a second conductive line connected to a drain node of the amplifying transistor.

13. An MRAM memory device according to claim 12, further comprising a third conductive line connected to a gate node of the reference transistor.

14. An MRAM memory cell according to claim 12, wherein a first magnetic field applied through the magnetoresistive element via a first conductive line combined with a second magnetic field applied proximate the magnetoresistive element via a second conductive line are sufficient to switch a magnetic moment of the magnetoresistive element.

15. An MRAM memory cell according to claim 13, wherein the first conductive line extends in a first direction and the second and third conductive lines both extend in a second direction.

16. An MRAM memory cell according to claim 15, wherein the first and the second directions are substantially orthogonal to each other.

17. An MRAM memory cell according to claim 10, further comprising a sense amplifier, wherein the amplifying transistor includes a drain node that is connected to the sense amplifier.

18. An MRAM memory cell according to claim 10, wherein the amplifying transistor further includes a source node and a drain node, wherein the drain node of the second transistor is connected to a program line located proximate to the magnetoresistive element.

19. An MRAM memory cell according to claim 10, wherein the amplifying transistor further includes a source node and a drain node, wherein the source node of the second transistor is connected to a program line located proximate to the magnetoresistive element.

20. An MRAM memory cell according to claim 10, wherein the magnetoresistive element further comprises a magnetic tunneling junction.

* * * * *